United States Patent [19]

Habich et al.

[11] Patent Number: 4,946,708

[45] Date of Patent: Aug. 7, 1990

[54] PIN TRANSFER ADHESIVE APPLICATION FOR SURFACE MOUNT COMPONENT PROCESSES

[75] Inventors: Adolph B. Habich, Georgetown; Karl Hermann, Austin; Ronald E. Hunt, Georgetown; Verlon E. Whitehead, Austin, all of Tex.

[73] Assignee: International Business Machines Corporation, Armonk, N.Y.

[21] Appl. No.: 273,523

[22] Filed: Nov. 18, 1988

[51] Int. Cl.$^5$ .............................................. C23C 26/00
[52] U.S. Cl. ...................................... 427/96; 118/255; 118/200; 118/216
[58] Field of Search .................. 427/96; 118/255, 200, 118/216

[56] References Cited

U.S. PATENT DOCUMENTS

| | | | |
|---|---|---|---|
| 4,527,890 | 7/1985 | Heiart | 355/102 |
| 4,569,305 | 2/1986 | Ferri | 427/96 |
| 4,813,130 | 3/1989 | Fey | 427/97 |

OTHER PUBLICATIONS

Webster's Seventh New Collegiate Dictionary, G & C Merriam Company, 1963, pp. 170 & 476.
"Pin Transfer-Mations", R. Barto et al., Circuits Manufacturing, Jun. 1987, pp. 68–69.
Product Bulletin #08A, Heller Industries, Inc.
"Centech Corporation Provides Equipment Leadership for Implementing Surface Mount Technology", Product Bulletin of the Centech Corporation.

Primary Examiner—Shrive Beck
Assistant Examiner—Vi Duong Dang
Attorney, Agent, or Firm—Robert M. Carwell

[57] ABSTRACT

A glue plate module automatically establishes layers of adhesives thereon periodically interposed between an upper pin plate and a lower lift plate. The pin plate carries a plurality of pendantly disposed and releaseable transfer pins arranged on the plate in a pattern corresponding to that of a desired adhesive dot pattern to be placed on a component board. The pins momentarily contact the adhesive layer to receive adhesive dots. The lift plate supports a circuit board to be populated with the adhesive dot pattern. Means are provided to periodically move the pin plate and lift plate together in momentary contact whereby the adhesive dots carried by the pins are transferred to the board surface in the desired pattern. Conveyor means positioned virgin board onto the lift plate prior to adhesive transfer and remove the boards thereafter. Means are provided to compensate for non-uniform distances between pins and correlative board locations receiving adhesive dots caused by board warpage or the like. In one embodiment momentary opposing clamping forces are disposed across the board surface on either side to flatten the board prior to adehsive dot deposition. The pins include spring members providing compliance to further compensate for irregularities in pin-board separation. Appropriate spacing of pins and means providing the clamping forces facilitates adhesive transfer to boards pre-populated with components on one or both sides.

22 Claims, 15 Drawing Sheets

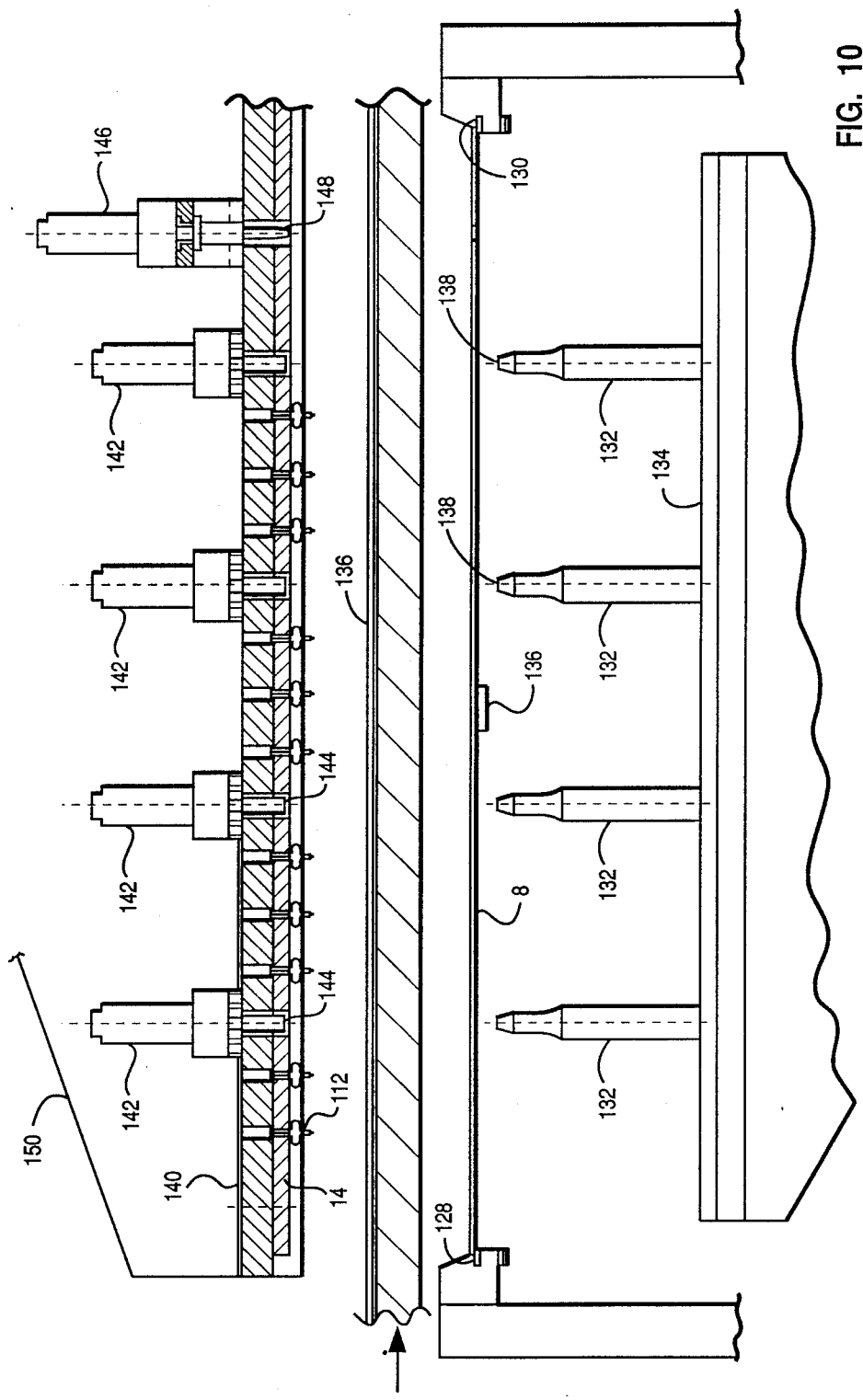

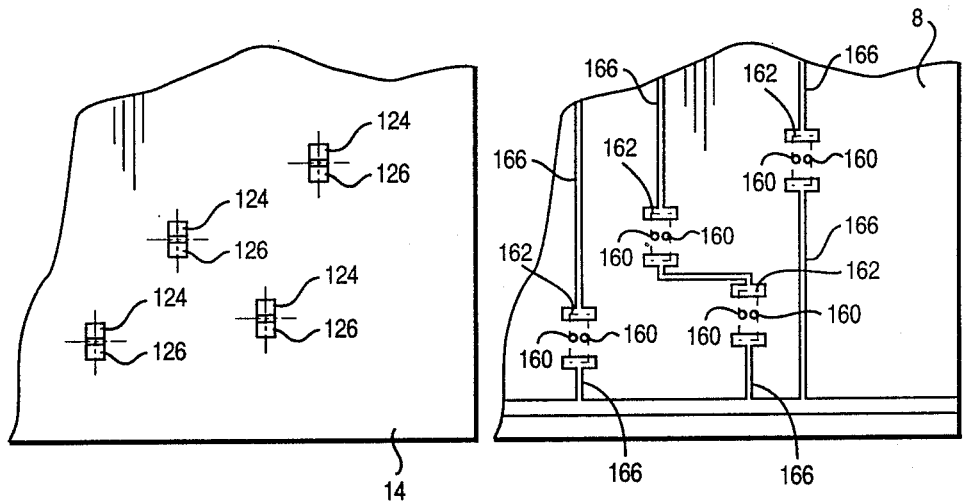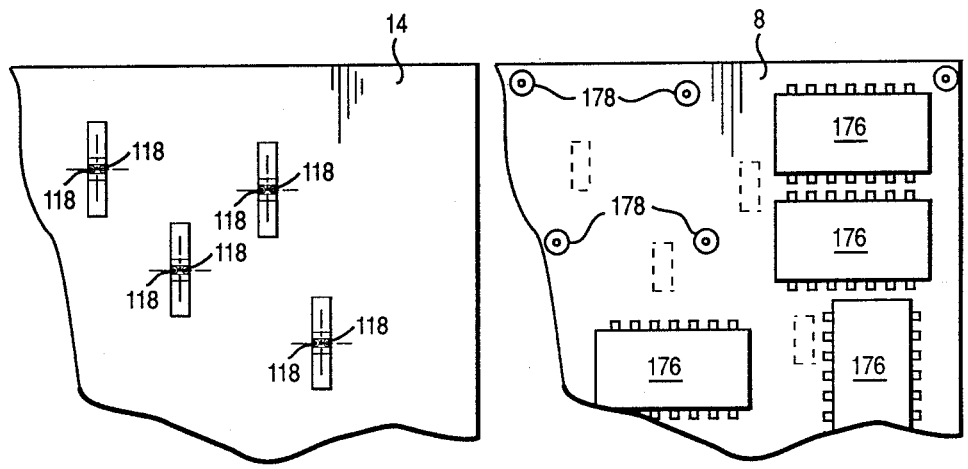
FIG. 13A  FIG. 13C
FIG. 13B  FIG. 13D

PIN TRANSFER ADHESIVE APPLICATION FOR SURFACE MOUNT COMPONENT PROCESSES

TECHNICAL FIELD

This invention relates to systems and methods for use in automatic placement of electronic components on circuit boards and, more particularly, to methods and apparatus for automated adhesive application to such boards for retention of surface mount components thereon.

BACKGROUND ART

Due to many factors including the high cost of labor associated with populating circuit boards with components, technology in the electronic manufacturing arts has developed to automatically place such components on boards. The component placement art has developed to a point where a board may be populated with hundreds of components in a matter of seconds and simultaneously electrically interconnected in a desired fashion by well-known wave solder techniques or the like, as in the case of the emerging surface mounted component technology.

Whereas the component placement equipment and soldering systems have improved tremendously contributing to a rapid throughput in the overall manufacturing process for electronic boards or cards and the like, it has recently been appreciated that weak links or bottlenecks in the manufacturing chain can effectively reduce or eliminate the net gains achieved by improvements in other areas of the process such as the aforementioned advances in soldering and component placement techniques.

One such area recently recognized as having a great impact on the overall process is in the application of adhesives on the electronic cards or boards for purposes of affixing the components thereto during the component placement operation. This technology has become particularly important with the emergence of surface mounted components lacking any intrinsic means of holding themselves in place in contrast with conventional through-hole components held in place by built-in lead preforming, clinching, swagging, or the like.

In a typical application of such surface mount technology, wherein the surface mounted components are wave soldered to the bottom of a board, the components are held by adhesive to the bottom of the board during the soldering period. In some applications such as the reflow soldering process, the surface mount components are retained in position on the top of the board until completion of the soldering by means of an adhesive. Due to several factors such as slight asymmetry or irregularity in the solder lands to which the components are to be soldered, vibration, sliding, tombstoning or floating, the need became apparent for a means of placing accurate and reliable dot patterns of adhesives on the planar surface of the boards during the manufacturing process. Moreover, it further became evident that if such a process step was not to become a bottleneck in the overall electronic card/board manufacturing process, it was necessary to provide a system to place such dots not only reliably but extremely rapidly so as to keep pace with the emerging simultaneous component placement and soldering techniques.

Accordingly, the conventional prior art means for adhesive transfer rapidly became woefully inadequate, namely various apparatus having pressure syringes for depositing adhesive dots. Drawbacks of such apparatus included large system size and mechanical complexity rendering the system difficult to clean and maintain but, more importantly, limitation on the number of dots which might be placed simultaneously to relatively few.

Such limitations gave rise to refinement of an old art, namely screen printing, for this new application. Whereas such a system was relatively simple and provided for ease of cleaning and maintenance as well as simultaneous dot placement and uniform dot size, numerous disadvantages were nevertheless present. The most serious of these was the requirement that the planar surface presented to the screen printing process be substantially flat with no obstructions. However, this was impractical due to the requirements of modern electronic design which typically included boards already pre-populated with other components often of varying heights prior to commencement of the surface mount process, as, for example, in the case of pre-population with pin and hole components by a different process or other components such as trim pots, variable capacitors, or the like having different vertical dimensions from standardized SMT components or the like. Related to this problem was the conventional practice of populating both sides of a board rendering it difficult to support the unpopulated flat surface of one side of the board presented to the screening process when the opposing side was pre-populated with the aforementioned components of varying heights.

Such difficulties and disadvantages with the screen printing technique gave rise to yet a third method of adhesive application known as the pin-transfer process. In such a process a pin plate or pin array is fabricated for each printed circuit board or substrate to be processed. Pins are positioned in a plane on the plate in locations corresponding to the desired locations of adhesive dots on the work piece. During the process, the thus-fabricated pin plate is momentarily positioned so that the pin ends lightly contact a controlled thin layer of adhesive whereupon drops of the adhesive adhere to the pin ends. The pin plate and board are thence urged toward one another in any manner of mechanisms to effect momentary contact of the plurality of pins with the planar surface of the board. Upon withdrawing the pin board, adhesive dots are thereby deposited on the planar surface of the board in the desired pattern corresponding to the predetermined spatial relationship of the pins on the pin board and, of course, the desired spatial positioning of the surface mount components to be affixed to the board.

Such pin transfer systems provided numerous advantages. The process was relatively simple with little maintenance and provided ease of control of the adhesive quantity and the like. However, there were nevertheless numerous serious disadvantages presented by such a system. First, notwithstanding advances in automated tooling and fabricating machines such as CAD-CAM equipment, fabrication of pin plates was nevertheless costly and time consuming. It will be appreciated that a new pin plate was required for every variation of component makeup and positioning associated with different circuit board products. Thus, for example, design modification required the machining or etching of an entire new pin board or set of such boards to form pins in the desired pattern. Secondly, whereas the aforementioned pressure syringe system was adapted in some cases to accommodate non-flat systems, the pin transfer systems suffered the same drawback of the screen printing techniques, namely that they were primarily adapted for accommodating flat surfaces. One reason for this was that the pins, being fashioned of a metal are substantially non-compliant and thus, for example, could not accommodate curved or irregular surfaces such as those typically presented by slightly warped boards common in the art or larger boards by means of increasing the pressure with which the pins and the circuit board were brought into contact. Such inability to accommodate irregular surfaces resulted in non-uniform dot placement and, in the worst of cases, failure to place some adhesive dots at all. Yet additional drawbacks of pin transfer systems known in the art included manual steps required in the process which accordingly did not lend itself to rapid, modern production line techniques.

Due to the large numbers of extremely small components capable of being rapidly and simultaneously placed on boards and electrically connected thereto, it is readily apparent that an adhesion transfer system was highly desired which provided for extremely accurate and simultaneous adhesive pattern placement. Moreover, such a system was highly desired which readily accommodated easy and economical changes in the desired spatial positioning of the adhesive pattern to accommodate different products. Moreover, such a system was desired which further could accommodate wide variances in the characteristics of the surface presented for adhesive deposition in terms of irregularities including those associated with warpage, large boards, and boards pre-populated with other components, as well as the problems well known in the art associated with pre-population of boards on the opposing side to that which was to receive the adhesive transfer.

SUMMARY OF THE INVENTION

A glue plate module automatically establishes layers of adhesives thereon periodically interposed between an upper pin plate and a lower lift plate. The pin plate carries a plurality of pendantly disposed and releaseable transfer pins arranged on the plate in a pattern corresponding to that of a desired adhesive dot pattern to be placed on a component board. The pins momentarily contact the adhesive layer to receive adhesive dots. The lift plate supports a circuit board to be populated with the adhesive dot pattern. Means are provided to periodically move the pin plate and lift plate together in momentary contact whereby the adhesive dots carried by the pins are transferred to the board surface in the desired pattern. Conveyor means positioned virgin boards onto the lift plate prior to adhesive transfer and remove the boards thereafter. Means are provided to compensate for non-uniform distances between pins and correlative board locations receiving adhesive dots caused by board warpage or the like. In one embodiment momentary opposing clamping forces are disposed across the board surface on either side to flatten the board prior to adhesive dot deposition. The pins include spring members providing compliance to further compensate for irregularities in pin-board separation. Appropriate spacing of pins and means providing the clamping forces facilitates adhesive transfer to boards pre-populated with components on one or both sides.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

FIG. 10 is a side elevation view, partly in section, of the conveyor/plate lifter module of the apparatus of the present invention in a first operational state prior to contact between the pins of FIG. 9A carried by the pin plate and the glue plate.

FIGS. 13A and 13B are top and bottom views, respectively, of a pin plate showing a plurality of pin components installed therein to illustrate a greatly simplified desired pattern of pin components and corresponding glue dots to be placed on a component board.

FIG. 13C and 13D are top and bottom views, respectively, of a representative component board 8 illustrating correspondence between the pattern of pin components shown in FIGS. 13A and 13B and the pattern formed by components to be placed on the component board.

DETAILED DESCRIPTION OF THE PREFERRED EMBODIMENT

First an overall general description will be provided of the structure and operation of the present invention prior to a more detailed description of the structure and operation of the various components thereof.

Figure 1:
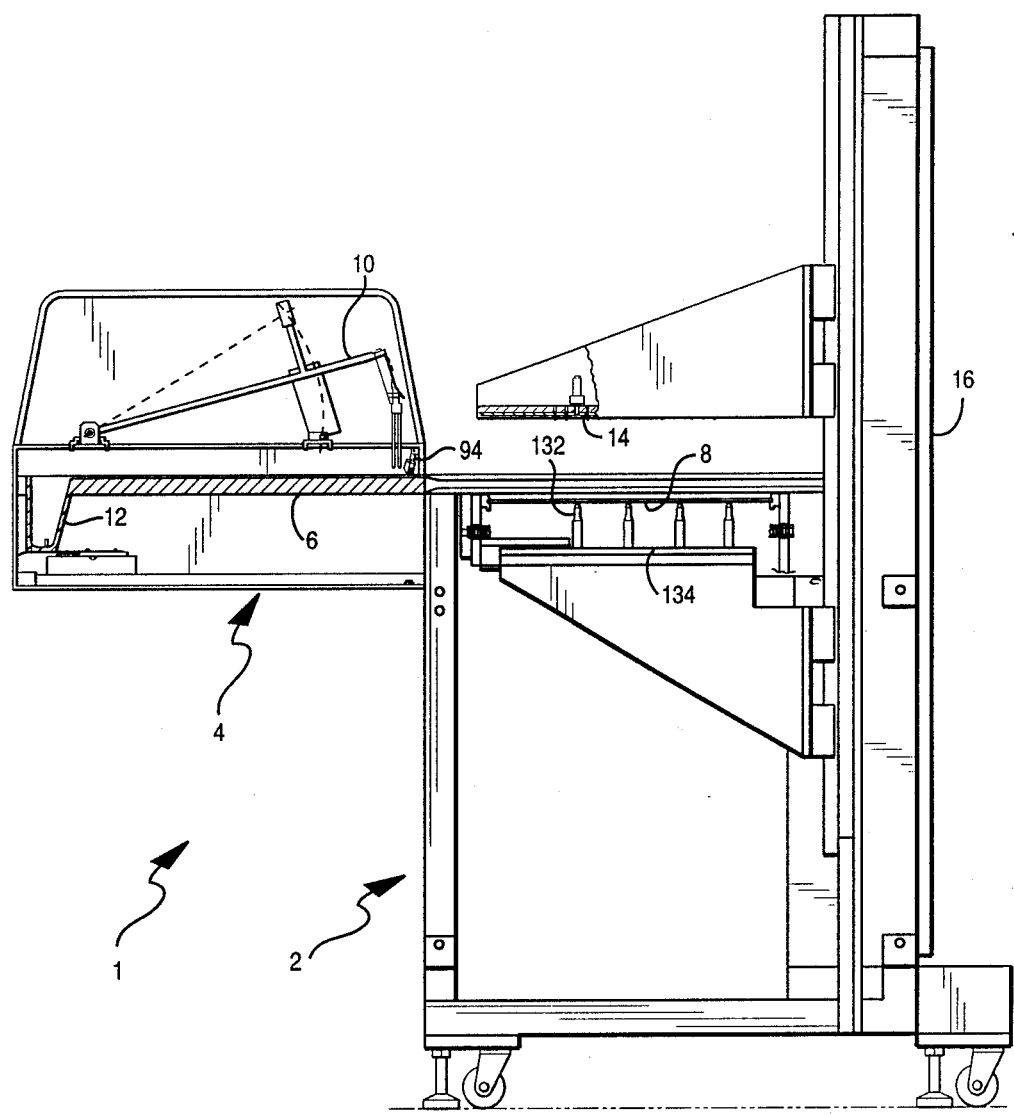
FIG. 1 is a pictorial view, partly in section, of the apparatus of the present invention depicted at a first operational state.
Figure 2:
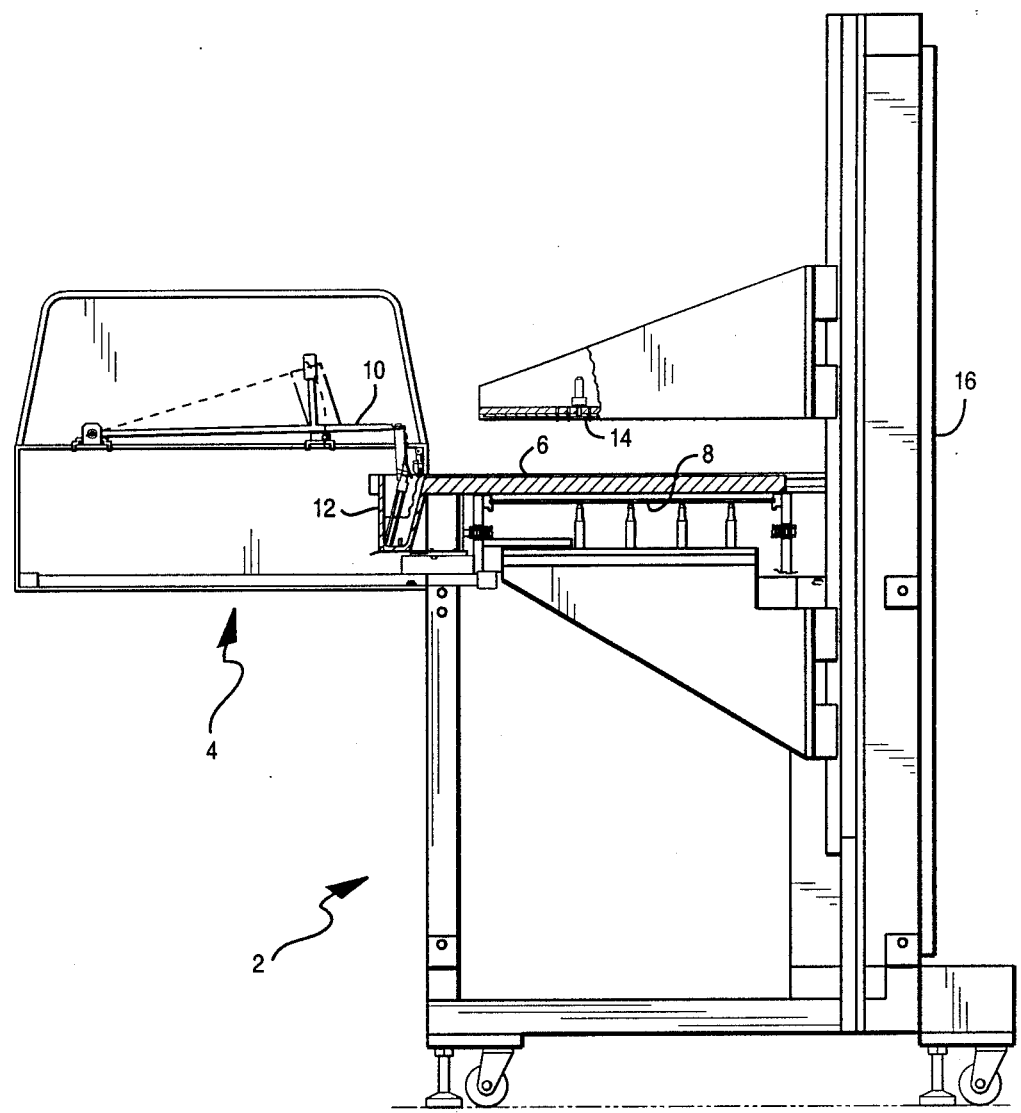
FIG. 2 is a pictorial view, partly in section, of the apparatus of the present invention depicted at a second operational state.

Referring first to FIG. 1 and 2, there is shown an apparatus 1 for gang placement of a product-dependent pattern of glue dots to lands on a printed circuit board. The apparatus includes conveyor/plate lifter module 2 and a glue plate module 4. Translating glue plate 6 of module 4 periodically moves into and out of vertical registry with module 2, travelling in directions generally perpendicular to that of a conveyor which carries circuit board 8 laterally into and out of module 2 prior to and after deposition of the glue dots on the PC board 8, respectively.

A pin plate 14 has a plurality of glue dot pins (FIG. 9A) pendantly disposed therefrom in a predetermined pattern. The pattern corresponds to the pattern of glue dots desired to be deposited on the PC board 8, each dot of which is intended to retain a corresponding component on the PC board 8 when populated. FIG. 1 shows plate 6 retracted back into the glue plate module 4 where the upper surface thereof will be periodically coated with a layer of glue in a manner to be described. FIG. 2 shows plate 6 extended into module 2 where the layered glue on the upper surface of plate 6 is lifted by the lowermost portions of the pins carried by plate 14 and transferred to corresponding locations on the upper surface of circuit board 8.

With reference and more detail to the latter step of glue being deposited from the upper surface of glue plate 6 to the pins and thence to the upper surface of the board 8, glue module 4 is basically comprised of a pivoting glue-lifter assembly 10, the aforementioned translating glue plate 6 with a resident glue pot 12, and a glue knife member 94 for spreading a thin film of glue on the translating plate 6. Conveyor/lifter module 2 holds the patterned pin plate 14 for lifting the glue from plate 6. A modular frame assembly 16 is further provided for positioning pin plate 4 and circuit board 8 together in momentary contact periodically to establish glue dot transfer from the lower ends of pins in the pin plate 14 to the upper surface of the circuit board 8.

In summary then, the frame assembly 16 carries a conveyor mechanism (to be described in more detail hereinafter) whereby the printed circuit board 8 requiring glue dot deposition and subsequent component placement will be introduced to the conveyor assembly and drawn into vertical registry with the pin plate 14 (which, it will be recalled, will carry the plurality of downward extending glue dot pins of FIG. 9A). Mechanism associated with the glue plate module 4 also to be hereinafter described and including glue-lifter assembly 10 and glue pot 12, will cause a thin layer of glue from the pot 12 to be deposited on the upper surface of the glue plate 6 whereupon the plate translates to the right (with reference to FIG. 1) until the plate 6 is disposed in vertical registry between and with the pin plate 14 and circuit board 8. The lower protruding ends of the pins in the pin plate 14 are thence caused to momentarily contact the upper glue layer surface of the glue plate 6, also by means of a mechanism to be hereinafter described. The glue plate 6 is thence automatically moved in the leftward direction of FIG. 1 from the position shown in FIG. 2 back into containment within the glue plate module 4 as shown in FIG. 1. It will be appreciated that from the aforementioned steps, the apparatus 1 will be in a condition whereby the various pins of the pin plate 14 are poised in vertical registry over the desired locations on the upper surface of the circuit board 8 wherein glue dots are to be placed. Moreover, also from the aforementioned steps, it will be further appreciated that the lower portions of the pins on the pin plate 14 will have then picked up glue dots from contact with the upper surface of the glue plate 6.

Next, the pin plate 14 and circuit board 8 are caused to be moved together relatively in the vertical direction so as to effect momentary contact between the lower portions of the pins carried on the plate 14 and the upper surface of the circuit board 8, thereby causing the pins to deposit the glue dots carried on the lower portions of the pins onto the upper surface of the circuit board 8 in the desired pattern. The pin plate 14 and circuit board 8 are thence moved apart in the vertical direction relatively, whereupon the conveyor mechanism causes the board 8 which has just had glue dots deposited thereon on in the desired pattern from the aforementioned operations to be ejected from the apparatus 1 such as in a direction outwards of the page toward the reader. The operation may then be repeated in a desired fashion wherein the next virgin board absent the glue dots will be placed on the opposing side of the frame assembly on the conveyor from that side which just ejected the board 8 and upon further operation of the conveyor, this next circuit board 8 is in like manner brought into vertical registry with the pin plate 14 whereupon the process repeats in depositing glue dots in the desired pattern on the next such board 8.

Figure 15:
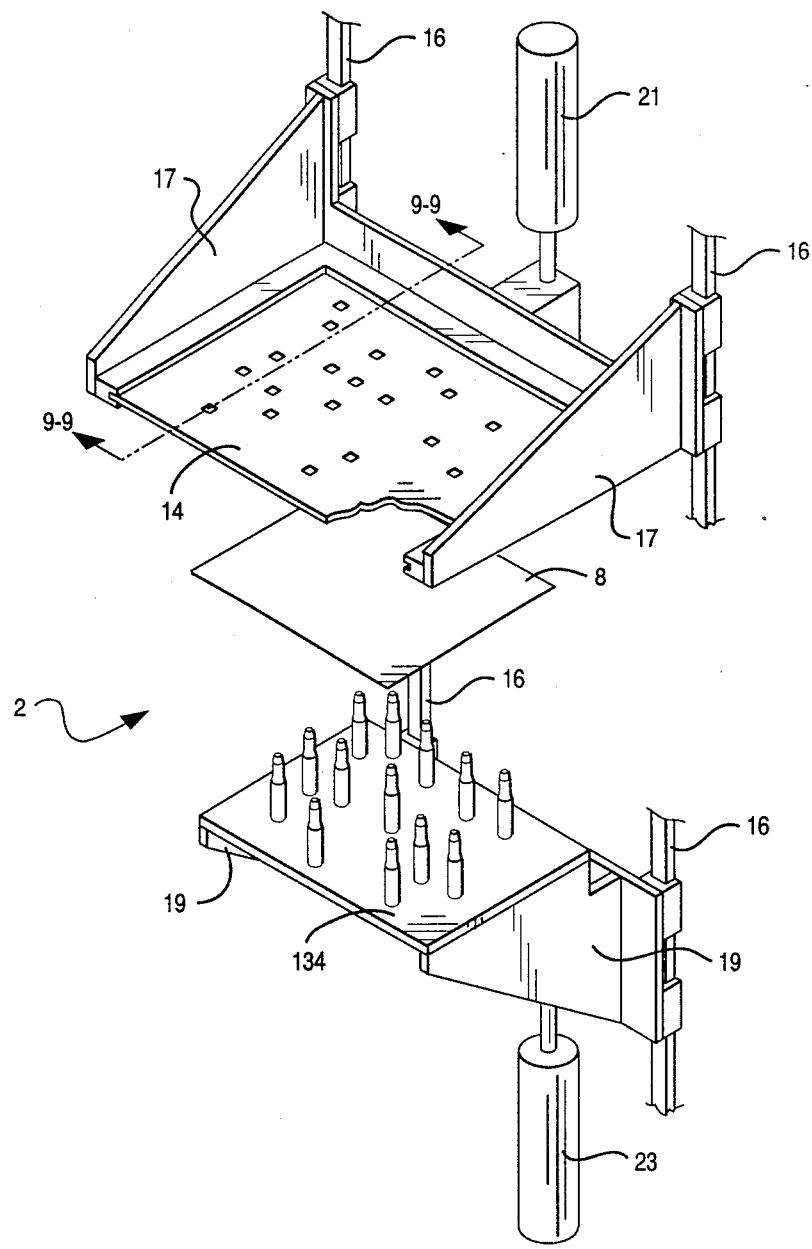
FIG. 15 is an exploded pictorial view of a portion of the conveyer plate/lifter module of FIG. 1.

Referring to FIG. 15 briefly, apparatus for effecting the relative movement of pin plate 14 and lower lift plate 134 towards and away from the circuit board 8 may be seen. The pin plate 14 is supported by upper bracket 17 which slides vertically on the frame assembly member 16. Interconnected between these brackets 17 and the frame assembly 16 is a pneumatic cylinder 21. Upon energization of this cylinder 21, the bracket 17 may be urged upwards and downwards in the direction of the longitudinal axis of the frame assembly 16, thereby translating the pin plate 14 supported by the brackets 17 in the desired vertical direction. In like manner, brackets 19 which support the lower plate 134 ride also on the frame assembly 16. A pneumatic cylinder 23 when activated urges the lower plate 134 in the desired vertical direction.

Figure 3:
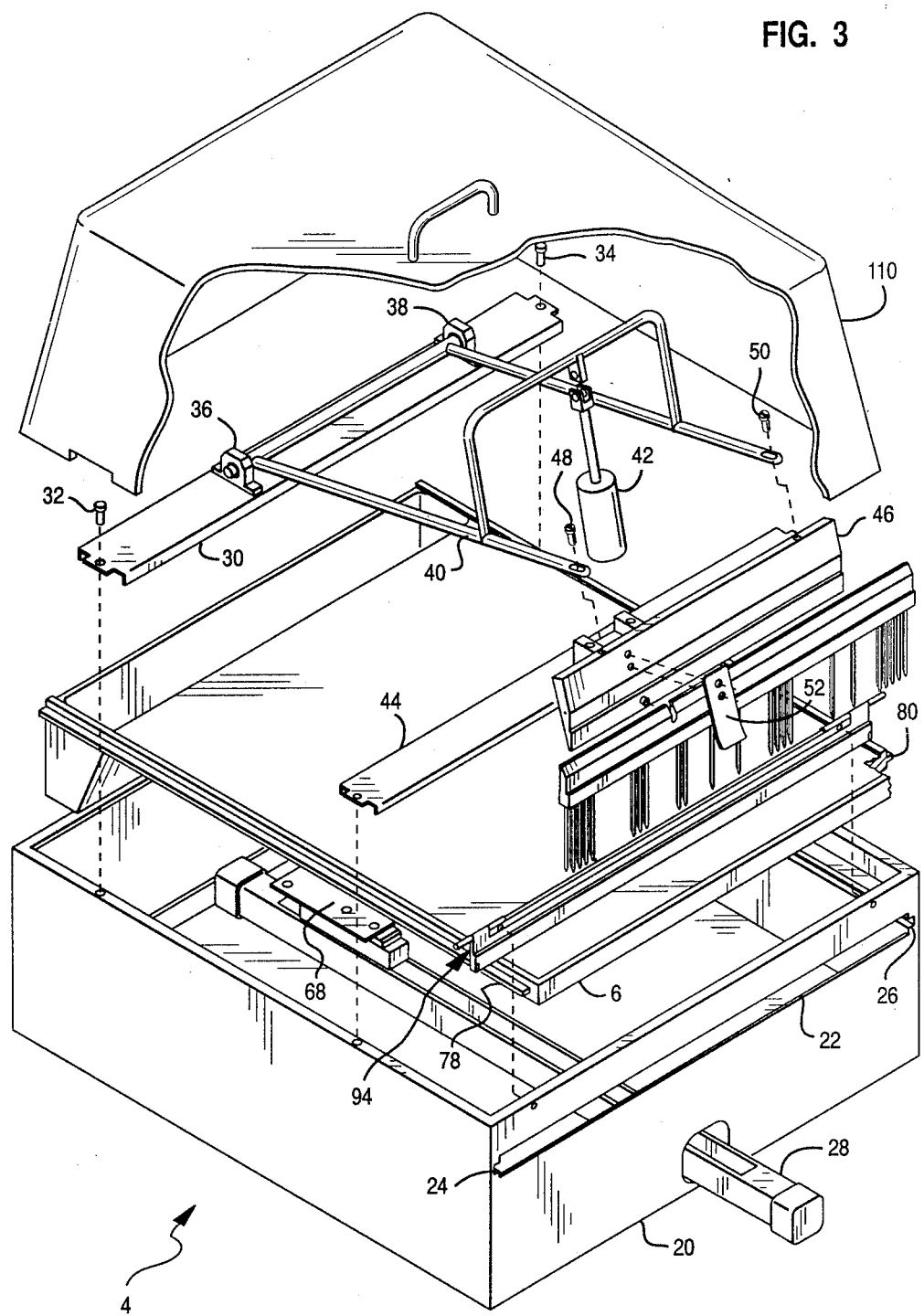
FIG. 3 is an exploded pictorial view, partly in section, of the glue plate module portion of the apparatus of FIG. 1.
Figure 4:
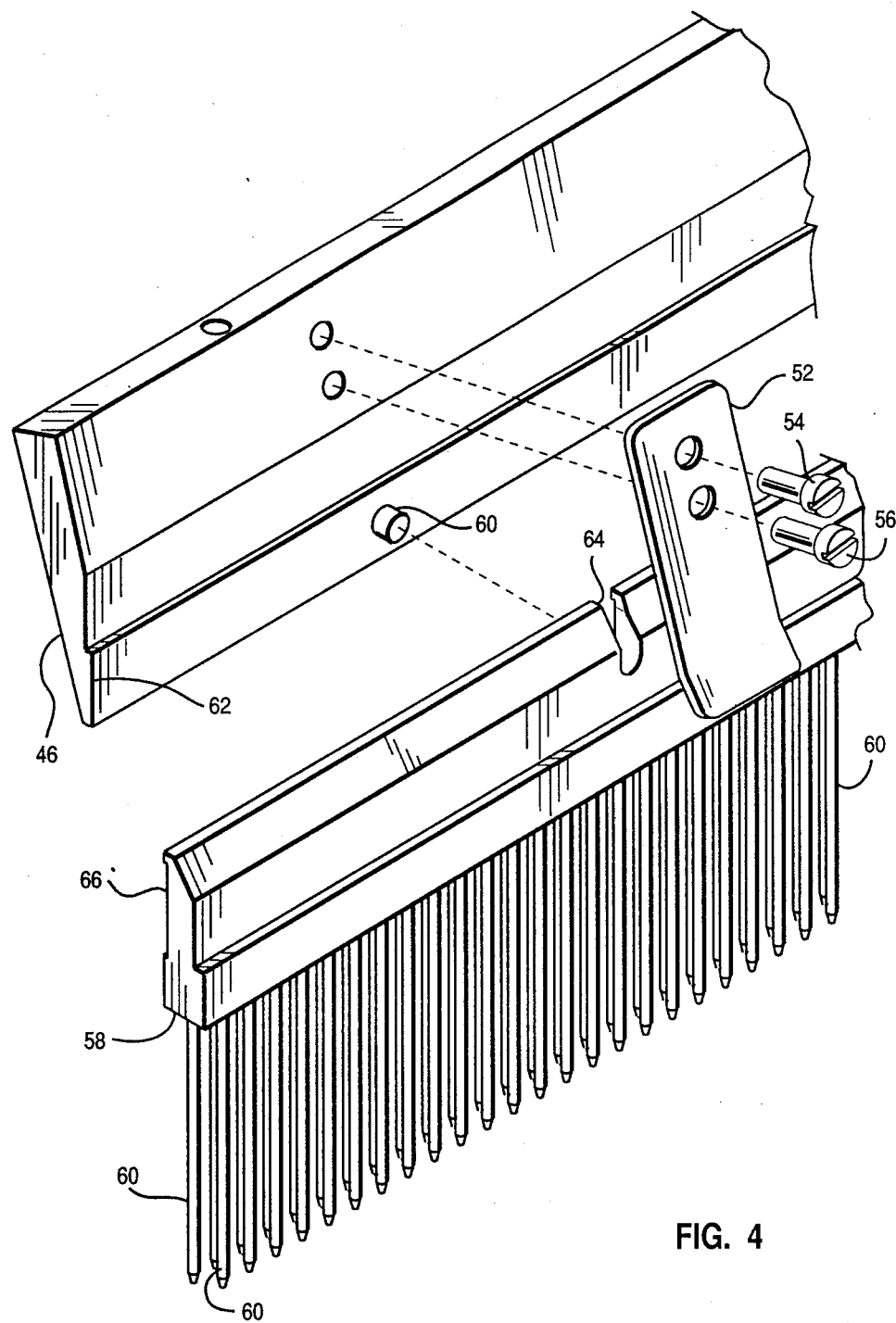
FIG. 4 is an exploded pictorial view of a portion of the frame module illustrated in FIG. 3.

Referring now to FIG. 3, glue plate module 4 consists of a lower structural member 20 containing a slot opening 22, drawer slide grooves 24 and 26, and an air cylinder 28. Cross member 30, attached to frame 0 by screws 32 and 34, hold bearing blocks 36 and 38. A wireform lifter arm 40 rotates in blocks 36 and 38 and is raised and lowered by air cylinder 42 which is attached to cross member 44. Mounting block 46 is attached to lifter arm 40 by screws 48 and 50. FIG. 4 more clearly shows leaf spring 52 fastened to mounting block 46 by screws 54 and 56. Glue finger assembly 58, comprised of a plurality of fingers 60, is for lifting and distributing glue in a manner which will be hereinafter described. Glue finger assembly 58 snaps on and off mounting block 46 for ease of cleaning. Pin 60 in raised surface 62 on block 46 cooperate with slot 64 and groove 66 on assembly 58, respectively, to locate parts together and spring 52 provides a holding force as required.

Figure 5:
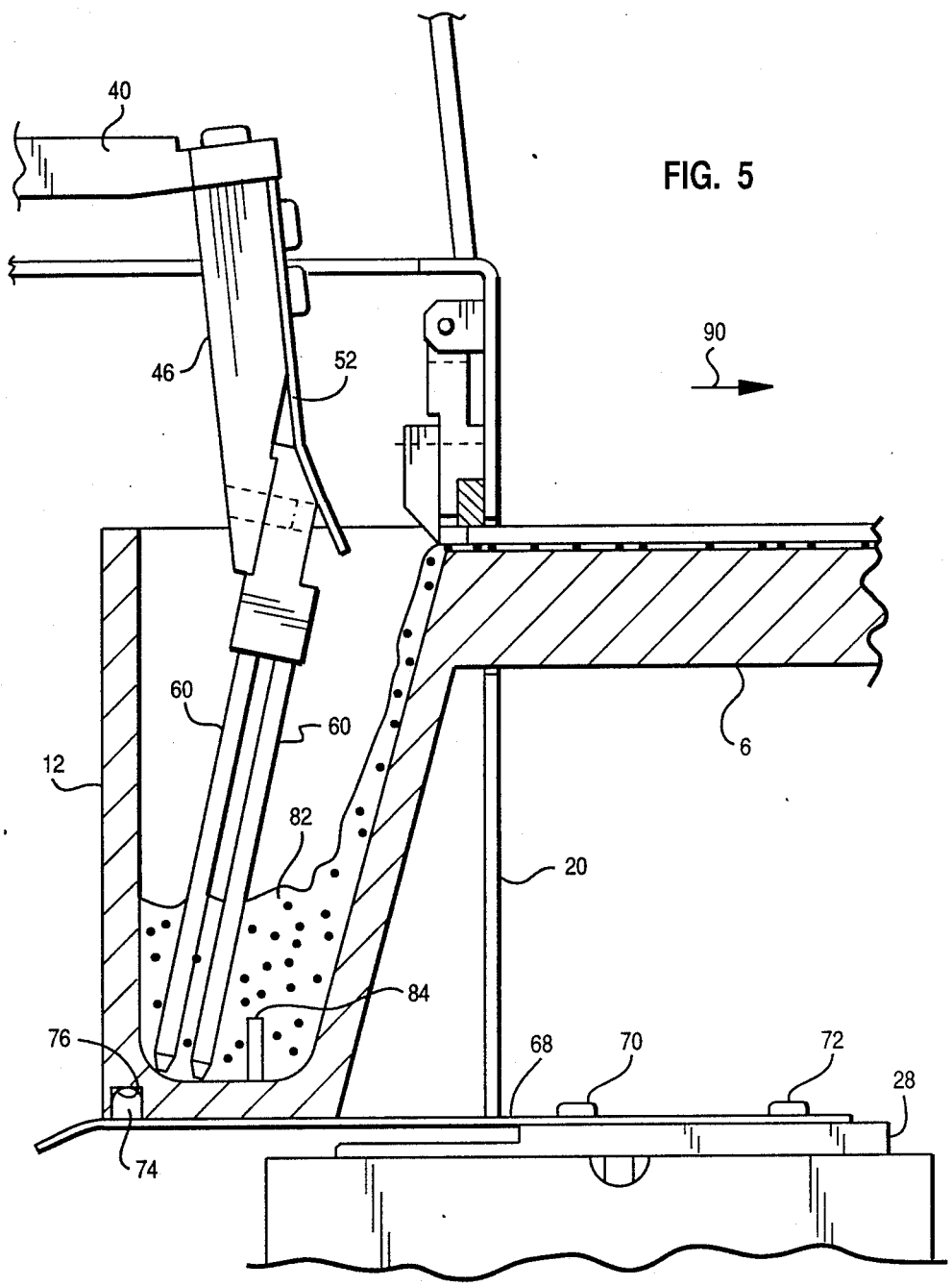
FIG. 5 is an elevational view, partly in section, of a portion of the glue plate module depicted in FIG. 1 in a first operational state.

Referring now to FIGS. 3 and 5, a substantially flat glue plate 6 and attached glue pot 12 are removable attached for ease of cleaning to a conventional rodless air cylinder 28. Leaf spring 68 is mounted to air cylinder 28 by screws 70 and 72. Locking pin 74 is fixedly attached to spring 68 and mates with hole 76 in the bottom of glue pot 12 to attach glue plate 6 to air cylinder 28. Rails 78 and 80, on the edge of plate 6, slide in drawer slide grooves 24 and 26 in frame module 20, respectively, when driven by air cylinder 28.

Figure 6:
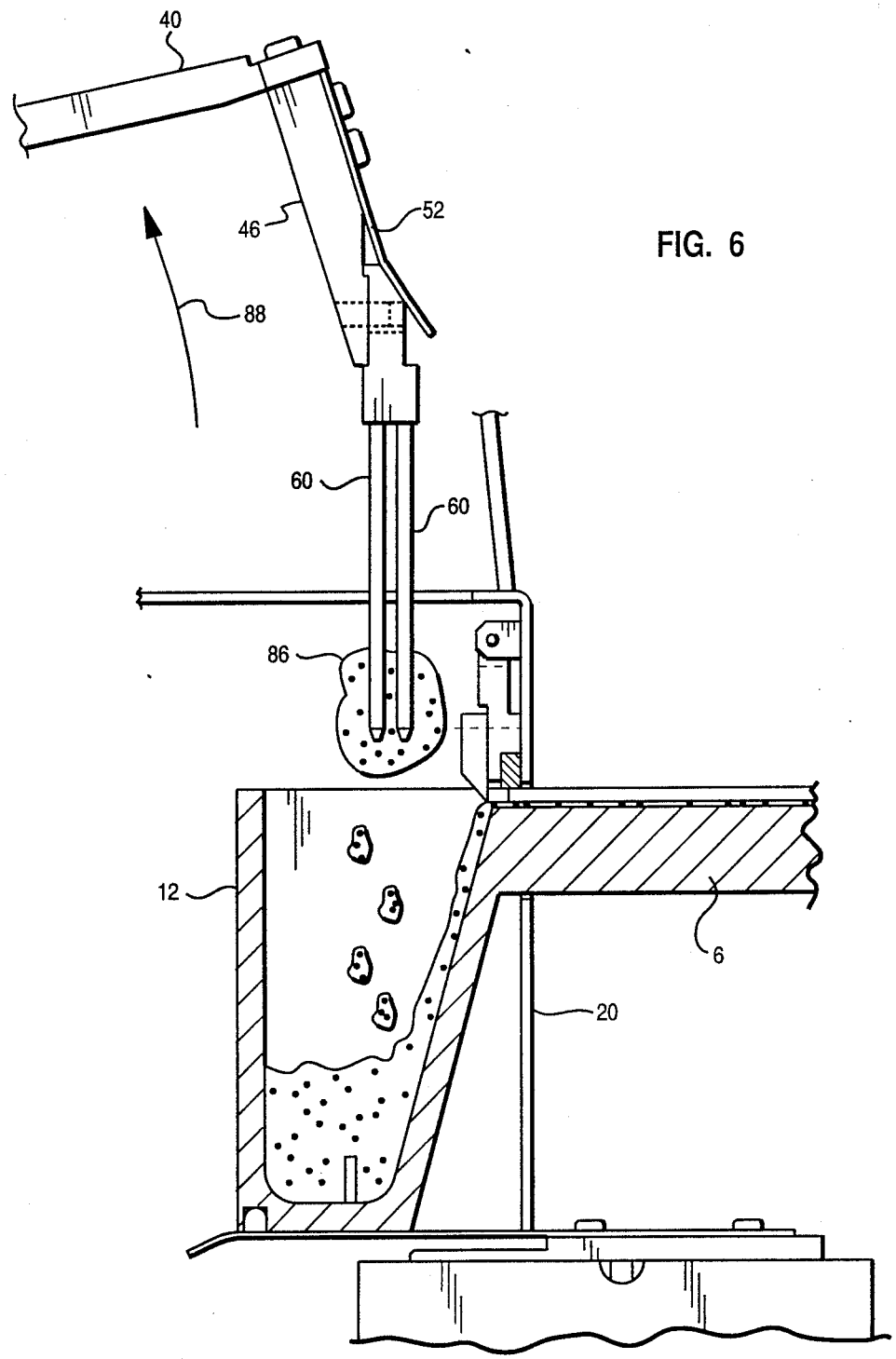
FIG. 6 is an elevational view, partly in section, of a portion of the glue plate module depicted in FIG. 1 in a second operational state.

Referring now to FIGS. 5-8, the method of glue application to the translating flat plate 6 will be described. In FIG. 5, plate 6 is shown fully extended to the right into conveyor/plate lifter module 2 (FIG. 2) in the direction of arrow 90 by air cylinder 28, with multiple fingers 60 being lowered by air cylinder 42 (FIG. 3) into glue 82 in pot 12. Pin 84 in the bottom of pot 12 is used as a visual low level glue indicator. In FIG. 6, arm 40 is shown rotated in the direction of arrow 88 by air cylinder 42, thereby raising pins 60 above plate 6. A residual glue mass 86 is retained by multiple pins 60.

Figure 7:
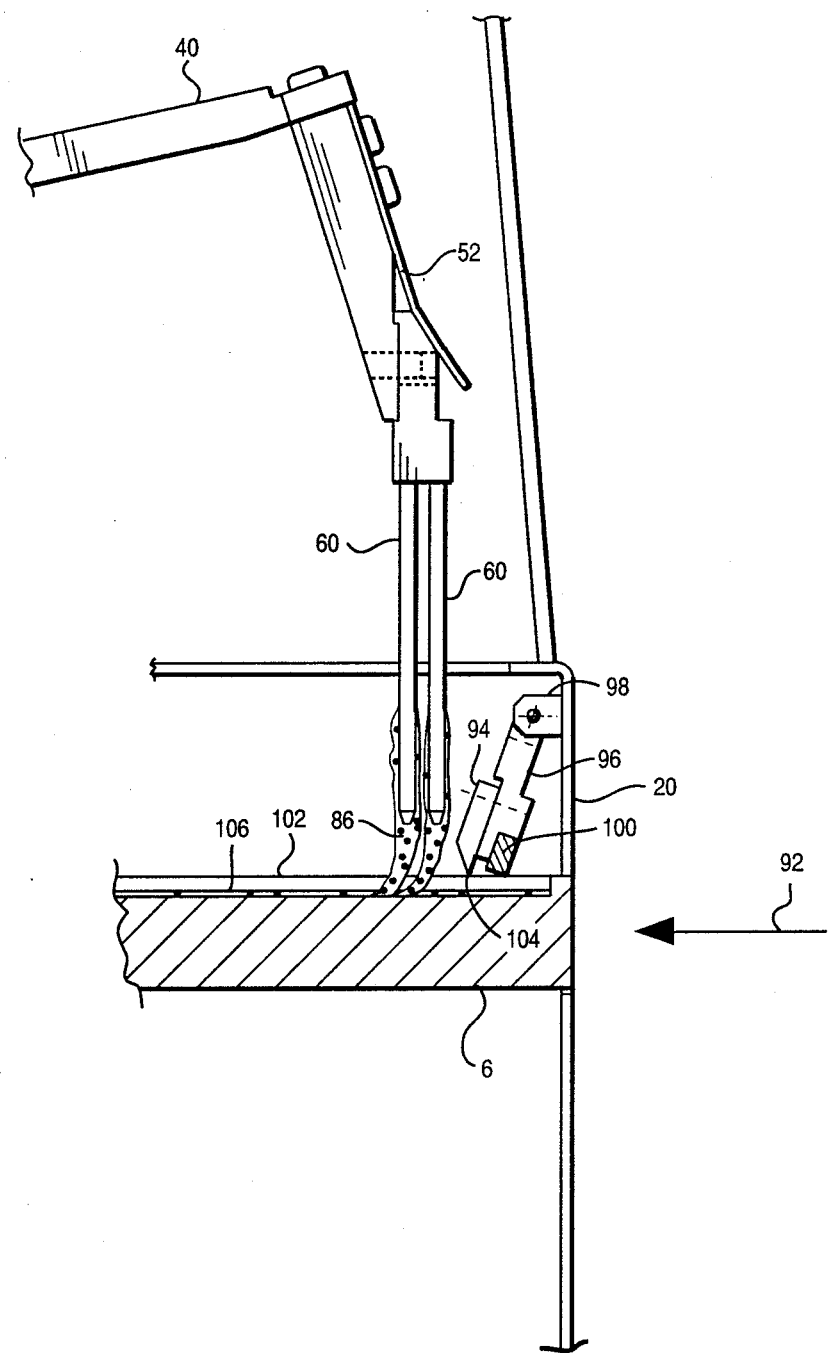
FIG. 7 is an elevational view, partly in section, depicting the adhesive spreading assembly of the glue plate module of FIG. 1 in a first operational state.

Now with reference to FIG. 7, plate 6 has been retracted into module 4 as shown in FIG. 1 and by arrow 92 from the position shown in FIGS. 2, 5 and 6. A glue spreader knife 94 is fixedly attached to pivot arm 96 which pivots freely in bearing blocks 98 on opposing sides of frame module 20. Elastomer block 100 rigidly attached to pivot arm 96 slidingly engages the edges 102 of plate 6 (see FIG. 14). When plate 6 is moved in the direction of arrow 92, the friction force of block 100 dragging on edges 102 rotates pivot arm 96 and glue spreader edge 104 on knife 94 clockwise, thereby lifting edge 104 above surface 106 on plate 6. During such movement, glue 86 drips from pins 60 onto glue plate surface 106.

Figure 8:
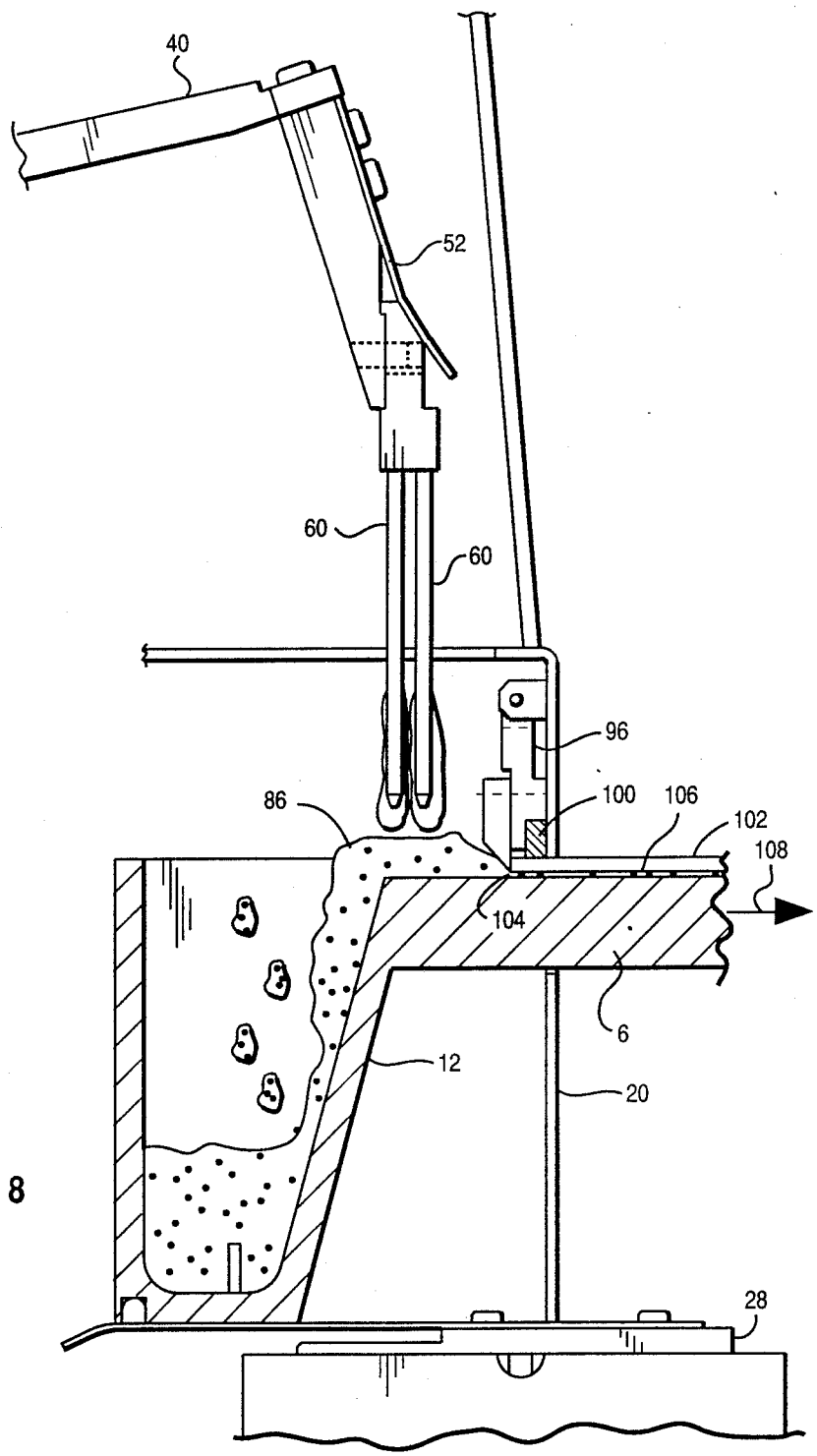
FIG. 8 is an elevational view, partly in section of a portion of the glue plate module of FIG. 1 in a third operational state wherein adhesive is initially being deposited on the upper surface of the glue plate.

Now referring to FIG. 8, plate 6 is shown being translated in the direction of arrow 108, as occurs when urged from the position of FIG. 1 to that of FIG. 2. During such movement the elastomer block 100, rubbing on the upper surface 102 of plate 6, rotates the pivot arm 96 counterclockwise until block 100 contacts frame 20. At this lock position, there is a small clearance between glue spreader edge 104 on the adjustable knife 94 and the glue plate surface 106 on plate 6. This clearance controls the thickness of glue spread on the surface 106 when plate 6 is translated in the direction of arrow 108 by air cylinder 28. The excess glue 86 is pushed back into glue pot 12 with a "squegee"-type action to be reused on the next cycle of the apparatus 1.

Figure 14:
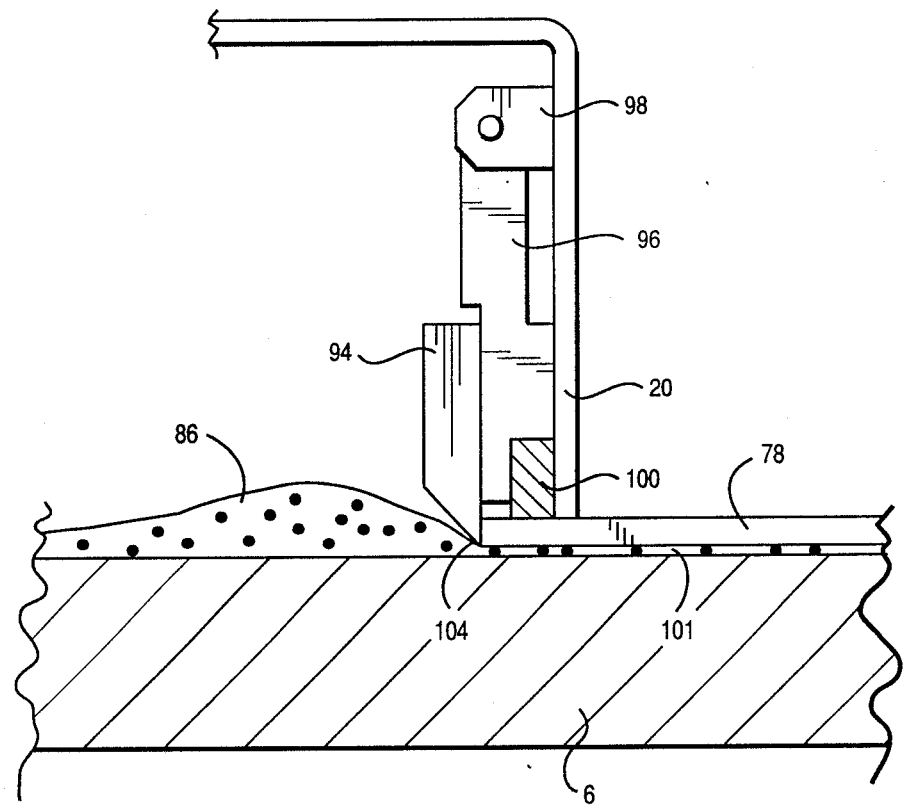
FIG. 14 is a side elevational view, partly in section, depicting the adhesive spreading assembly in another operational state.

In FIG. 14 the function of the elastomer block 100 may be seen more clearly depicted. When the glue plate 6 is moving to the right, the glue spreader knife 94 is rotated counterclockwise with elastomer block 100 being compressed so as to ride on the rail 78 with a stop preventing further counterclockwise rotation of this spreader knife and maintaining it in the substantially vertical position shown in FIG. 14. In this manner the uniform layer or film 101 of glue 86 is spread on the uppermost surface of the glue plate 6.

Referring back to FIG. 3, a transparent top cover 110 provides operator protection from moving parts as well as environmental protection from possible glue fumes while allowing the cycle to be observed.

Now that the description has been provided of how a thin film of glue is spread on flat surface 106 of translating plate 6, it will be hereinafter explained how portions of this glue film are lifted and transferred to the lands of a printed circuit board 8. A more detailed description of molded glue-transfer pin components 112 will now be given with reference to FIGS. 9 and 10. These pins, it will be recalled, are pendantly disposed from pin plate 14 in a pattern corresponding to the pattern of dots desired to be placed on a circuit board 8. First it will be noted from FIG. 9A that for a given pin 112 a plurality of cylinders 120 with tapered points 118 and end surfaces 114 may project from main body 116. This pin shape facilitates the pickup of a glue drop or drops, from the thin film of glue (deposited as just described on the upper surface 106 of plate 6) and the release of this drop to a land on the upper surface of board 8. Adjacent block 116 is a molded compliant elongated O-shaped spring member 122 which, by a spring-like action, limit the force of pin and surfaces 114 on the circuit board 8 and also provide a tolerance for small variations in heights of the pins or for the board 8 surface irregularities (caused by warpage of the board or the like). Above spring member 122 are two latch fingers 124 and 126 which latch in slots in flat pin plate 14 (see FIG. 10) and provide a small footprint method of attaching a plurality of pin components 112.

Figure 9A:
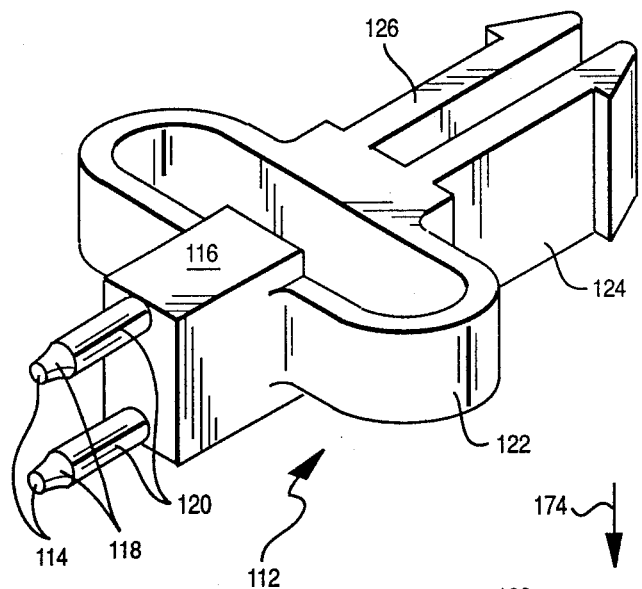
FIG. 9A is a pictorial view of a pin component carried by the pin plate of FIG. 1.
Figure 9B:
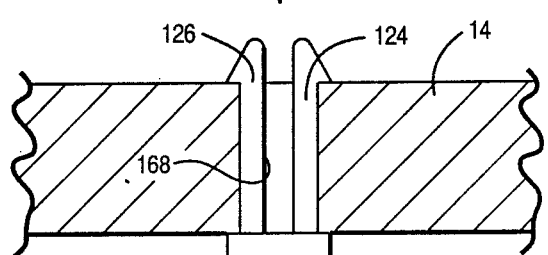
FIG. 9B depicts a side elevational view in section of the pin plate, component board, and a pin component of the present invention showing a representative pin component when installed in the pin plate.

FIG. 9B is an edge view taken along section line 9—9 of FIG. 15 of the pin plate 14 sectioned through one of the pin components 112 when installed on and thus carried by the pin plate 14. A plurality of apertures 168 are disposed through the pin plate 14 in a pattern corresponding to the desired location of adhesive dots on the surface of the component board 8. Also seen in FIG. 9B is a side view of a representative component board 8 indicating lands 170 on the upper surface thereof for electrical interconnection with a component such as the surface mounted component 175 shown in dashed lines. In accordance with the invention a dot of adhesive shown in dashed as reference numeral 172 will be disposed on the upper surface of the board 8, being deposited from the end surface 114 of the pin component 112 upon its contact with the upper surface of board 8. Upon subsequent placement of the surface mount component 175 on the adhesive dot 172 by means of various component placement machines, the components such as 175 will be caused to adhere to the board 8 for subsequent electrical interconnection between the leads thereof and the lands 170.

As the board 8 and pin plate 14 are urged toward one another as indicated by arrows 174, the glue adhering to the end surface 114 will be caused to contact the upper surface of the board 8. FIG. 9B illustrates the function of the spring member 122 of the pin component 112 in providing for compliant movement of the end surface 114 relative to the pin plate 14 thereby compensating for variations in distance between a particular end surface 114 and corresponding opposing location on the plate 8. Thus, as individual end surfaces 114 or the glue disposed thereon engage the surface of plate 8, additional relative movement shown by arrows 174 may continue without damage to the plate surface or adverse affects on deposition of the adhesive until glue dots carried by all desired such pin components 112 have engaged the plate 8 surface.

FIG. 10 shows a cross section of the circuit board portion of conveyor/plate lifter module 2 depicted in FIG. 1 taken along line 9—9 of FIG. 15. Pin plate 14 holds a plurality of glue transfer pins 112 in a product-determined pattern which corresponds to the lands on circuit board 8. Board 8 is supported and transported by continuous conveyor belts 128 and 130 which are driven by a motor means not shown. Circuit board 8 can be lifted from belts 128 and 130 by a plurality of support pins 132 fixedly attached to lower lift plate 134. A plurality of pins 132 are positioned so as to avoid vertical registry with any components 136 already assembled on the underneath surface of the board 8, and ends 138 of pins 132 thereby provide a flat plane of support for the board 8. Plate 134 is powered up and down in a conventional manner by an air cylinder, not shown.

Glue plate 6 with a thin film of glue 136 is shown as in FIG. 2 extended between board 8 and pin plate 14. Plate 14 is rigidly fastened to upper lift plate 140. Attached to plate 140 are a plurality of conventional air cylinders 142 that are positioned in vertical registry over corresponding pins 132. Shaft ends 144 of cylinder 142 will be employed as described later to flatten board 8 against corresponding pin ends 138. An air cylinder 146 fixed to plate 140 has a tapered aligning pin 148 which will be used also in a manner to be described to align board 8 to pin plate 14.

Figure 11:
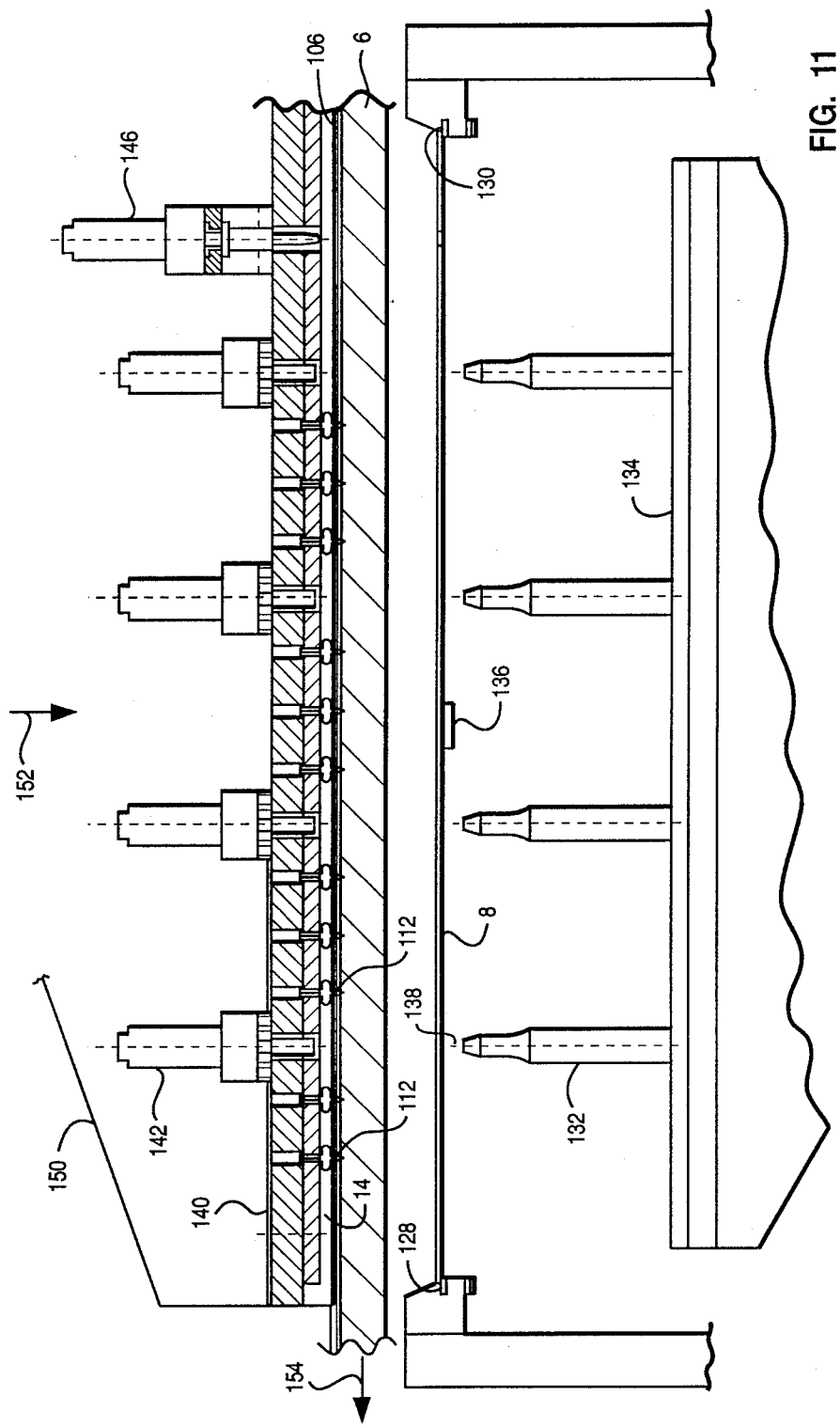
FIG. 11 is a side elevation view, partly in section, of the conveyor/plate lifter module of the apparatus of the present invention in the first operational state of FIG. 1 during contact between the pins of FIG. 9A and the glue plate.

Referring now to FIG. 11, upper lift plate assembly 150 is lowered in the direction of arrow 152 until ends 114 (see FIG. 9A) on glue pins 112 rest on the thin glue film 106 on plate 6. Pressure is applied downward on upper lift plate assembly 150 forcing the partial collapse of spring members 122 (see FIG. 9A) of pins 112 assuring contact of all pins to glue film 106 on plate 6. Plate assembly 150 is then raised and plate 6 is retracted as shown by arrow 154. Glue has thereby accordingly now been transferred to the ends of pins 112 from the plate 6.

Figure 12:
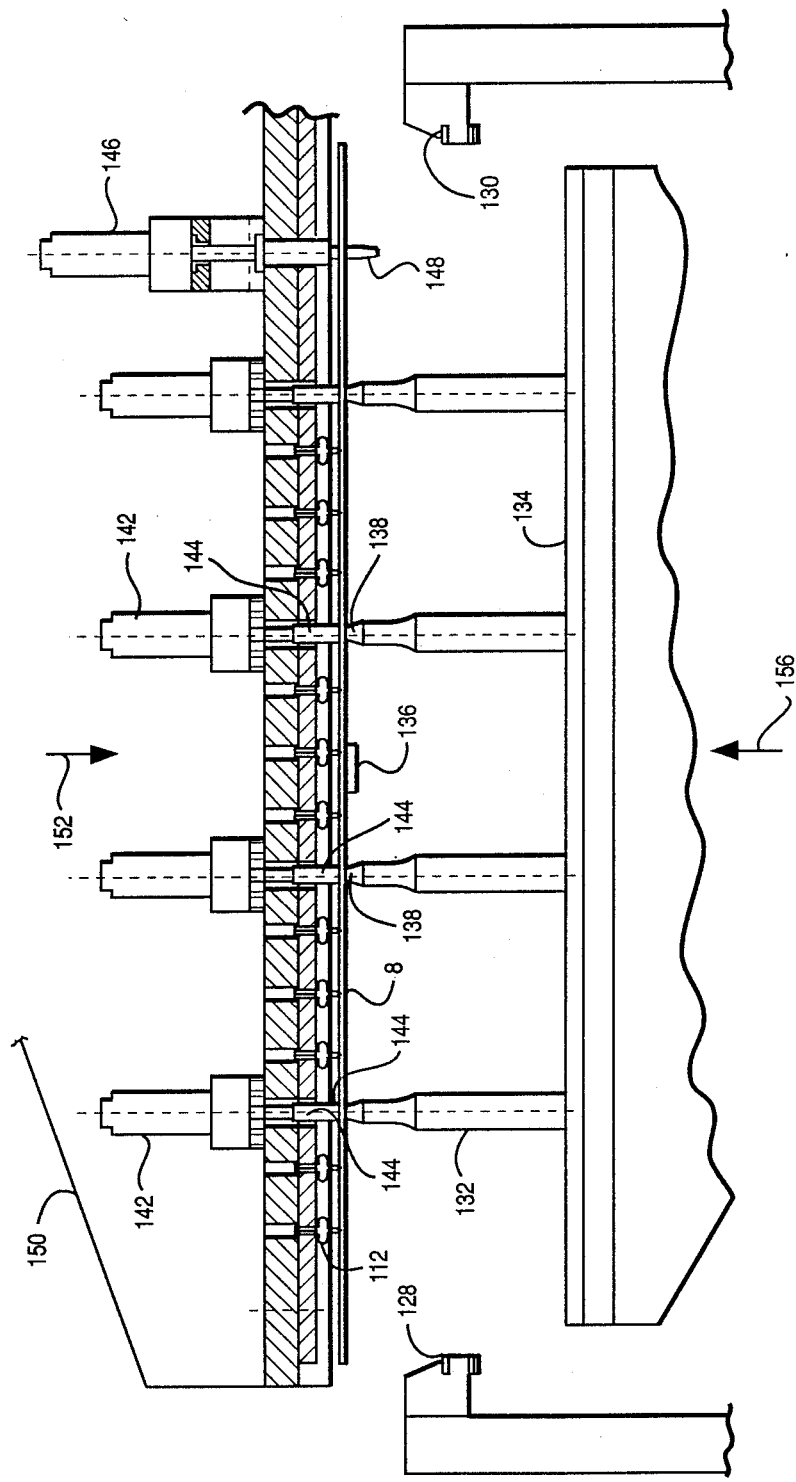
FIG. 12 is a side elevation view, partly in section, of the conveyor/plate lifter module of the apparatus of the present invention in the first operational state of FIG. 1 during contact of the pins of the pin plate with the board 8 so as to deposit the desired adhesive dot pattern on the plate (NOTE: Insert in prior description of FIG. 11 so as to cause pins to pickup adhesion dots from the glue plate for subsequent deposition on the plate)

FIG. 12 depicts backup plate 134 lifting board 8 off conveyor belts 128 and 130 in the direction of arrow 156 and upper plate assembly 150 being lowered in the direction of arrow 152 with board 8 being sandwiched therebetween. Aligning pin 148 on air cylinder 146 is extended into a mating hole in board 8, thereby locating board 8 in a preselected horizontal position before ends 114 on glue pins 112 come to rest on the preselected lands of board 8. Air cylinders 142 are thence energized so as to urge plunger ends 144 to flatten board 8 against pin ends 138, with the ends 144 and 138 being in vertical registry. Upper plate assembly 150 is then raised, and lower plate 134 is lowered thereby leaving board 8 with glue drops on the selected lands and the board resting on conveyor belts 128 and 130. Board 8 is then conveyed out of the assembly 1 by means of the belts 128 and 130 and a new board brought into the assembly by such means and the cycle is thereby completed.

In FIG. 13A there may be seen a pin plate 14 having a plurality of the hereinbefore described pin components 112 installed therein in corresponding spatial relation to the spatial relation defined by surface mounted components 162 to be placed on the component plate 8 as shown in FIG. 13C. In FIG. 13A which is a top view of the pin plate 14, a plurality of pin components 112 depicted in greater detail in FIG. 9B may be seen carried by the plate 14 with the uppermost portions of the latch fingers 124 and 126 of each respective pin component 112 being visible. FIG. 13B is a bottom view of the pin plate 14 of FIG. 13A indicating the pattern of tapered points 118 formed by their corresponding pin components 112 carried by the board 14. It will be recalled that in accordance with the glue loading operation hereinbefore described with reference to the apparatus of the present invention, the end surfaces 114 shown in FIG. 13B of the pin components 112 will eventually become loaded with glue dots for subsequent deposition on the upper surface of the component board 8.

With reference to FIG. 13C, the aforesaid upper surface of board 8 is shown depicted therein after the end surfaces 114 of the pin components 112 carried by the pin plate 14 have been urged adjacent the upper surface of the component board 8 so as to deposit glue dots 160 in the desired pattern on the upper surface of the component board 8. It will be noted that the resultant pattern of glue dots 160 disposed on the surface of board 8 is simply a function of the predetermined spatial positioning of the pin components 112 in a given pin plate 14 and the corresponding spatial positioning of the end surfaces 114 of their respective pin components 112. Still referring to FIG. 13C surface mounted components 162 are shown therein in phantom indicating the function of the glue dots 160 in causing the components 162 to adhere to the board 8 adjacent their respective lands 170 shown in FIG. 9B. Electrically conductive paths functionally represented by reference numeral 166 are interconnected to these lands 170 in desired patterns and once the components 162 have been placed on their respective glue dots 160, such interconnection between the components 162 may be completed as provided by these paths 166 by any number of means known well in the art in effecting electrical interconnection between the paths and corresponding lands 170 such as by wave soldering or the like.

In FIG. 13D, a bottom view is shown of a representative but highly simplified circuit board 8 having components 176 already pre-populating the board 8 prior to deposition of glue dots on the board 8 in accordance with the invention. The purpose of FIG. 13D is to schematically indicate that the support pins 132 (FIG. 10) may be disposed in a pattern on the lower lift plate 134 so as to contact the lower surface of board 8 at locations 178 away from the components 176 so as to provide a uniform support field formed by the uppermost ends of the support pins 132 against the lower surface of board 8 thereby avoiding irregularities formed by the premounted components 176. This feature contributes significantly to the ability of the pin components 112 to effect uniform placement of a plurality of glue dots on the upper surface of the board 8 by providing a uniform underneath support for the board 8 throughout its planar surface. This is particularly beneficial when it is necessary to counteract the additional forces required to bring all of the end surfaces 114 of the pin components 112 into proper contact with the upper board surface 8 during conditions wherein the distances between all end surfaces 114 and corresponding opposing locations on the upper surface of board 8 differ (as, for example, in the case of a warped board or the like).

Reference back to FIG. 13C will also indicate that in some instances the upper surface of board 8 may also be pre-populated by components such as that represented at reference numeral 180 prior to effecting the glue deposition in accordance with the invention. In like manner to the just-described case in which support pins 132 may be positioned on lift plate 134 to accommodate such components 176, it will be appreciated that the pin components 112 may in like manner be positioned as desired in the pin plate 114 so as to avoid contact of the end surfaces 114 with such previously installed components 180.

Before describing some details of a particular embodiment an overall summary of the steps of operation of the apparatus would be helpful. With the apparatus shown in the operating state of FIG. 2, it will be recalled that the glue fingers 60 are disposed downwards in the glue pot 12 and the glue plate 6 is disposed rightwards into the conveyor plate/lifter module 2. Upon energization of the air cylinder 42 (FIG. 3) these glue fingers 60 are moved upwards to the position shown in FIG. 6. Upon energization of the air cylinder 28, the glue plate 6 is thereby moved outwards of the conveyor/plate lifter module 2 and leftwards from the operating position shown in FIG. 2 to that of FIG. 1. During such movement of the glue plate 6 leftwards and underneath the fingers 60 the glue mass 86 (FIG. 6) is caused to drip onto the upper surface of the plate 6. A component board 8 is thence inserted into the side of the conveyor/plate lifter module 2 and conveyed by means of the belts 128 and 130 into position between the pin plate 14 and lower lift plate 134. During such movement leftwards, the glue spreader knife 94 is rotated clockwise slightly off the vertical as shown in FIG. 7. Upon re-energization of the air cylinder 28, the glue plate 6 is moved rightwards from the position and operating state shown in FIG. 1 to that of FIG. 2. During such movement, it will be recalled the glue spreader knife 94 is moved into the vertical position in FIG. 8 with the glue spreader edge 104 contacting the upper surface 102 of the glue plate surface 106 thereby spreading out the somewhat irregularly previously deposited glue drippings into a uniform layer on the top of the glue plate 6.

When the rightward travel of the glue plate 6 is completed as shown in FIG. 2, the air cylinder 21 of FIG. 15 is activated moving the plate assembly 150 downwards from the position of FIG. 11 to that of FIG. 10 whereby the end surfaces 114 of corresponding pin components 112 contact the uniform glue film 136 on the upper surface of glue plate 6 so as to receive glue dots thereupon. The air cylinder 21 is thence reactivated to lift the plate assembly 150 back to the position shown in FIG. 10. The air cylinder 28 is next reactivated causing leftward movement again of the glue plate 6 outwards of the conveyor/plate lifter module 2. When the glue plate 6 is first moved to the right depositing the glue at the end of the travel, the glue fingers will fall back into the glue pot 12 replenishing the supply of glue on the finger 60 in preparation for the next cycle.

Glue dots have thereby been transferred to the pins 112. Air cylinder 23 of FIG. 15 is thence activated moving the lower lift plate 134 and support pins 132 carried thereby in an upwards direction into engagement with the lower surface of the component board 8. Similarly, air cylinders 142 of FIG. 12 are also activated urging the upper lift plate in a downwards direction. Air cylinder 146 is thence activated to bring aligning pin 148 into mating engagement with a hole in board 8 thereby locating the board 8 before the glue on the ends of end surfaces 114 contact the upper surface of the board 8. Air cylinders 142 are thence further energized so as to urge end surfaces 114 closer toward the component board 8 thereby depositing the glue dots in the desired pattern on the upper surface of board 8. It will be recalled that the sandwiching effect provided by the force of the air cylinders 142 urging the pin plate 14 downwards and the support provided by the support pins 132 will flatten board 8 against the support pins 132 to provide a more uniform planar surface for receipt of the glue dots from the end surfaces 114. Downward motion of assembly 150 compresses spring members 122 of pins 112 allowing compliance of pins to the board 8. The upper plate assembly 150 is then raised and the lower lift plate 134 lowered in response to appropriate energization of air cylinders 21 and 23, respectively, leaving the board 8 with the glue dots on the selected lands. The board 8 is thence conveyed out on belts 128 and 130 and a new board brought in for a next glue transfer cycle.

It will be appreciated that whereas a particular embodiment has been disclosed relating to deposition of glue dots adapted for use in double sided surface mounted component processes, the invention admits to a wide range of embodiments, applications, and variations requiring various adjustments and adaptations in a manner known to those skilled in the art. For example, application of the invention is not intended to be limited to placement of glues or adhesives only but contemplates placement of other fluid materials as desired such as solder paste or the like in any desired pattern. In like manner, the invention need not be limited to applications only wherein it is desired to affix surface mounted components to a planar but may contemplate uses wherein patterns of some fluid are simply desired to be deposited on a planar surface whether or not used in conjunction with subsequent placement of articles thereon. It should be evident that adjustments in the timing of operation of various steps, clearances and tolerances and the like are also easily modified to meet the requirements of a particular application. For example, it may be desirable to adjust the clearance of the glue knife 94 to vary the glue layer thickness as desired. In a similar manner, it may be desirable to vary the amount of deflection vertically caused by the contact of the end surfaces 114 adjacent the upper surface of the plate 8 by means of any number of adjustments including composition of material of the pin components 112, thickness of the spring member 122, etc.

Figure 9C:
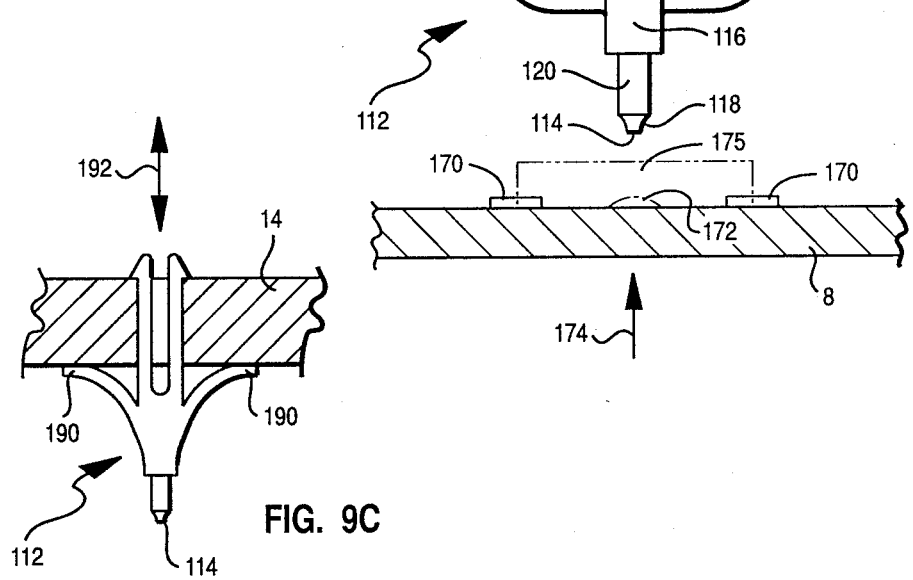
FIG. 9C depicts a side view in cross section of an alternate embodiment of the pin 122.

It will be appreciated that the pins of the invention admit to numerous alternate embodiments and are not intended to be limited to the form shown in FIG. 9A. For example, in the FIG. 9A embodiment two cylinders 120 and corresponding end surfaces 114 are shown. However, it is contemplated that in some applications it may be desirable to provide for only one such glue-dot forming extension from the pin component 112 or, in other applications, it may be desirable to provide more than the two which are shown. In like manner, the important feature of the pins 112 of the invention in providing compliance along the longitudinal direction is provided by means of the spring member 122 including the hollowed out portion. However, the invention contemplates alternate designs providing equivalent function. As but one example, the spring member 122 may in the alternative be provided by an intermediate portion of the pin component 112 taken up by the spring member 122 being fashioned of a solid resilient material such as rubber or the like. Alternatively, as shown in FIG. 9C, the pin 112 may include two or more fingers 190 or a disk-shaped radially outward extending portion of sufficiently thin wall thickness so as to provide the desired compliance or flexibility in the direction of arrows 192 when the pin tip 114 contacts the printed circuit board 8.

In a conventional application wherein it is desired to affix surface mount components on a planar, the following table indicates parameters that appear to provide consistent successful results in the placement of such components:

TABLE

| | |
|---|---|
| Adhesive | Amicon D-124F Uniset |
| Pin compliance, compression | .008–.011 |
| Pin composition | Delrin (Acetal) |
| Adhesive layer depth | Adjustable .020″–.040″, nominally .038″ |
| Temperature range | 68° F.–78° F. (20° C.–25.5° C.) |
| Length of time pin in glue layer | 1–20 sec. nominally 1–3 secs. |

While the invention has been shown and described with reference to particular embodiments thereof, it will be understood by those skilled in the art that the foregoing and other changes in form and details may be made therein without departing from the spirit and scope of the invention.

What is claimed is:

1. Apparatus for pin transfer of a fluid to a surface of a circuit board comprising
   a plate;
   means for depositing a layer of said fluid on said plate;
   a pin plate carrying a plurality of fluid applicator pins, said pins having pre-selected compliance;
   means for effecting momentary contact between said fluid layer and said pins;
   means for effecting momentary contact between said surface and said pins;
   a backup plate for supporting said board; and
   plate means for moving said fluid layer into and out of registry with said pin plate and said backup plate.

2. The apparatus of claim 1 wherein said pins are releaseably attachable to said pin plate.

3. The apparatus of claim 1 further including a plurality of clamping means for flattening said surface,
   each said clamping means contacting opposing surfaces of said board at opposing points and at a different one of a plurality of discrete locations distributed across said board.

4. The apparatus of claim 3 further including conveyor means for moving said circuit board into and out of registry with said pin plate and said backup plate.

5. The apparatus of claim 4 further including pin-and-hole means for locating said board in registry with said pin plate.

6. The apparatus of claim 3 wherein each of said discrete locations is offset from locations carrying components on said opposing surfaces of said board, thereby permitting said contacting of said opposing board surfaces by said clamping means at said discrete locations.

7. A pin plate assembly for use with a pin transfer apparatus to deposit fluid on a board surface defining a plurality of opposing locations, comprising
   a pin plate; and
   a plurality of pins each having an end surface opposing and corresponding to a different one of said opposing locations carried by said plate each of said pins further being mounted on flexible deformable means deformable in a direction normal to said plate.

8. The apparatus of claim 7 wherein said pins are releaseably mounted to said pin plate in a plane parallel to said plate.

9. The apparatus of claim 8 wherein when said board surface and said pin plate are disposed in parallel and urged together, said flexibility is such that pins initially contacting said surface are compressed in an amount sufficient to compensate for distance variations between said end surfaces and said corresponding opposing locations on said plate thereby permitting subsequent contact by a substantial remainder of said plurality of pins with said surface.

10. The apparatus of claim 6 wherein said means for depositing said layer of fluid on said plate includes
    a fluid assembly;
    a fluid pot; and
    a fluid spreader knife.

11. The apparatus of claim 10 including means interconnecting said finger assembly, said fluid pot, said spreader knife, and said plate means whereby
    during said registry of said plate means and said pin plate, said finger assembly is disposed in said fluid pot;
    during said moving of said fluid layer out of said registry, said finger assembly is disposed above said plate means depositing fluid onto said plate means; and
    during said moving of said fluid layer into said registry, said spreader knife is spreading said deposited fluid to create said layer.

12. A pin for use in a pin plate of a fluid pin transfer machine comprising
    latch means for releaseably attaching said pin to said plate;
    main body means for receiving said fluid to be transferred; and
    spring means for providing preselected compliance of said pin, said spring means including an aperture extending through said pin intermediately of said latch means and said main body means.

13. The apparatus of claim 12 wherein said main body means includes at least one elongate projection for contacting and carrying said fluid.

14. A method for effecting pin transfer of a fluid to a surface of a circuit board in a preselected pattern, comprising
    pendantly disposing a plurality of pins from a pin plate;
    establishing a layer of said fluid;
    momentarily contacting said layer with a plurality of said pins;
    automatically conveying said board to a location in registry with said pins;
    orienting said plate substantially parallel to said surface;
    establishing opposing clamping forces at a plurality of locations across said surface; and
    momentarily contacting said surface with said pins
    said step of momentarily contacting with surface including varying the force exerted by each of said pins against said surface during said momentary contact in functional relation to the distance between said each pin and a corresponding location on said surface when said plate and said surface are disengaged and in said parallel orientation.

15. The method of claim 14 wherein said step of momentarily contact said surface with said pins includes deforming a first portion of said pins initially contacting said surface when in said contact with said surface.

16. The method of claim 15 wherein said deforming is in an amount sufficient to permit subsequent contact by a second portion of said plurality of pins.

17. The method of claim 14 wherein said opposing clamping forces are introduced at each of said plurality of locations at opposing surfaces of a circuit board and between components carried by said surfaces of said circuit board.

18. A method for effecting pin transfer of a fluid to an upper surface of a circuit board in a preselected pattern comprising
   establishing a layer of said fluid;
   momentarily contacting said layer with a plurality of said pins;
   automatically conveying said board to a location in registry with said pins;
   establishing an underneath support field throughout said board's lower surface formed by uppermost ends of support pins avoiding components pre-mounted on said board; and and
   momentarily contacting said upper surface with said pins.

19. The method of claim 18 wherein said step of momentarily contacting said surface with said pins includes deforming a first portion of said pins initially contacting said upper surface when in said contact with said upper surface.

20. The method of claim 19 wherein said deforming is in an amount sufficient to permit subsequent contact by a second portion of said plurality of pins.

21. Apparatus for pin transfer of a fluid to a surface comprising
   a plate;
   means for depositing a layer of said fluid on said plate;
   a pin plate carrying a plurality of fluid applicator pins, said pins having pre-selected compliance;
   means for effecting momentary contact between said fluid layer and said pins; and
   means for effecting momentary contact between said surface and said pins.

22. A pin for use in a pin plate of a fluid pin transfer machine said plate defining a plurality of apertures therethrough, comprising
   finger means for releaseably immobilizing said pin on said plate after insertion into a respective one of said apertures;
   main body means for receiving said fluid to be transferred; and
   spring means for providing preselected compliance of said pin.

* * * * *

UNITED STATES PATENT AND TRADEMARK OFFICE
CERTIFICATE OF CORRECTION

PATENT NO. : 4,946,708

DATED : August 7, 1990

INVENTOR(S) : Adolph B. Habich, Karl Hermann, Ronald E. Hunt and Verlon E. Whitehead It is certified that error appears in the above-identified patent and that said Letters Patent is hereby corrected as shown below:

Col. 14, line 8, before "assembly", please insert --finger--; and
line 53, please delete "with" and insert --said--.

Signed and Sealed this

First Day of June, 1993

Attest:

MICHAEL K. KIRK

Attesting Officer

Acting Commissioner of Patents and Trademarks